United States Patent
Mikami

(10) Patent No.: US 8,958,059 B2
(45) Date of Patent: Feb. 17, 2015

(54) METHOD OF DETERMINING MASK PATTERN AND EXPOSURE CONDITION, STORAGE MEDIUM, AND COMPUTER

(71) Applicant: Canon Kabushiki Kaisha, Tokyo (JP)

(72) Inventor: Koji Mikami, Nikko (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 14/089,857

(22) Filed: Nov. 26, 2013

(65) Prior Publication Data

US 2014/0146311 A1    May 29, 2014

(30) Foreign Application Priority Data

Nov. 26, 2012  (JP) ................. 2012-257363

(51) Int. Cl.
*G01N 21/00* (2006.01)
*G03F 7/20* (2006.01)

(52) U.S. Cl.
CPC ........ *G03F 7/70483* (2013.01); *G03F 7/70616* (2013.01)
USPC .......................................................... 356/73

(58) Field of Classification Search
USPC ..................................... 356/72–73
See application file for complete search history.

(56) References Cited

U.S. PATENT DOCUMENTS

| 6,067,375 A * | 5/2000 | Tsudaka ................. 382/144 |
| 7,181,707 B2 * | 2/2007 | Kotani et al. ................. 716/52 |
| 2011/0107277 A1 | 5/2011 | Tsujita et al. |

FOREIGN PATENT DOCUMENTS

JP    2011095729 A    5/2011

* cited by examiner

*Primary Examiner* — Tarifur Chowdhury
*Assistant Examiner* — Abdullahi Nur
(74) *Attorney, Agent, or Firm* — Rossi, Kimms & McDowell LLP

(57) ABSTRACT

A determining method includes the steps of setting a first parameter to define the shape of the plurality of pattern elements of the mask, setting a second parameter to define the effective light source distribution; and repeating the process of calculation of the image of the mask pattern and calculation of a value of an evaluation item while varying the value of the first parameter and the second parameter to thereby determine the effective light source distribution and the mask pattern, wherein parameters of pattern elements are set as one parameter by using a value of an index representing the proximity effect.

12 Claims, 5 Drawing Sheets

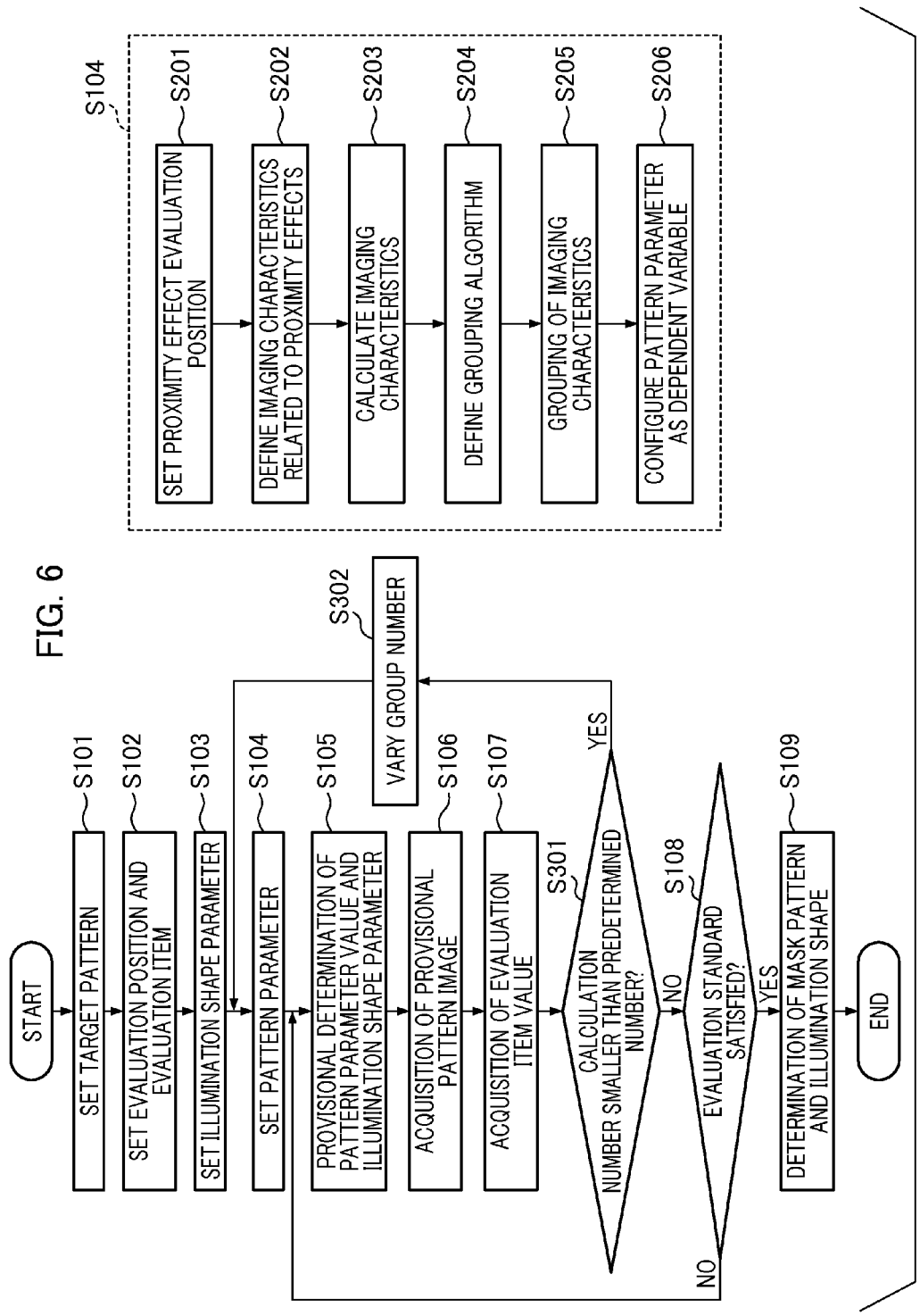

METHOD OF DETERMINING MASK PATTERN AND EXPOSURE CONDITION, STORAGE MEDIUM, AND COMPUTER

BACKGROUND OF THE INVENTION

1. Field of the Invention

The present disclosure relates to a method of determining a mask pattern and an exposure conditions, and to a storage medium, and a computer therefor.

2. Description of the Related Art

An exposure apparatus is an apparatus that transfers a pattern formed on a mask (original) through a projection optical system onto a photosensitive substrate (a wafer or the like that has a resist layer formed on its surface) in a lithography step included in the manufacturing process for a semiconductor device or the like. Recently the exposure apparatus is configured to execute optimization of an illumination shape (effective light source distribution), which is used as an exposure condition when illuminating the mask, or the mask pattern by use of a super-resolution technique such as deformation illumination, optical proximity correction (OPC) or the like in order to comply with the advances in device miniaturization. During optimization of the illumination shape, firstly, a target pattern for the device (layout pattern), an evaluation position for the image-forming characteristics, and an evaluation item at the evaluation positions (e.g. dimension, depth of focus (DOF), exposure margin, or the like) are set. Then, calculation is performed of the transfer pattern (pattern to be formed on the image plane of the projection optical system) that is associated with the change in the illumination shape to thereby obtain values for the evaluation items at the evaluation positions on the transfer pattern. The calculation of the transfer pattern and the computation of the evaluation values are repeated until the values satisfy the evaluation standard or until the number of times of changes to the illumination shape reaches a predetermined number of times. At this time, the illumination shape can be expressed numerically, and for example, in annular illumination with certain intensity, the illumination shape is expressed by a function that uses an inner σ and outer σas parameters (variables). These parameters are optimized using a Monte Carlo Method or the like. However, even if the pattern of the mask is the same, when the illumination shape is changed, the transfer pattern also changes. Therefore, when the illumination shape is changed, there is the possibility that the transfer pattern will be shifted from the target pattern. Thus, OPC is required in order to ensure correspondence between the transfer pattern and the target pattern. OPC is executed on each occasion the illumination shape changes or when the illumination shape is changed by certain amount. The method of sequentially correcting the illumination shape and the mask pattern in this manner is known as a conventional Source Mask Optimization (SMO) technique.

In this regard, it is becoming increasingly difficult to form a pattern with sufficient accuracy on a mask to keep pace with the rapid developments in miniaturization. This is due to the fact that the mask pattern is separately optimized from the illumination shape. As disclosed above, OPC is generally executed after determination (optimization) of the illumination shape as a result of the dependence on the illumination shape. Therefore, since the mask pattern changes as a result of the execution of OPC, it may be the case that an illumination shape that is determined prior to the execution of OPC will no longer be optimal. In this context, Japanese Patent Application Laid-Open No. 2011-95729 discloses an SMO technique for the simultaneous optimization of the illumination shape and the mask pattern when handling a library cell or the like that is a circuit element or a memory cell of a device. This technique enables determination of both the illumination shape (illumination shape parameters) and the mask pattern (pattern parameters) to thereby enable formation of the transfer pattern with sufficient accuracy on a substrate.

When applied to device patterns that have a relatively large number of figures such as cell blocks or peripheral circuits, the technique disclosed in Japanese Patent Application Laid-Open No. 2011-95729 requires time for convergence of the optimization due to the large number of pattern parameters that form part of the optimization variables. As a result, for example, although it may be proposed to cut off the optimization calculation at a predetermined number of times, in that case, high accuracy pattern parameters or illumination shape parameters cannot be obtained.

SUMMARY OF INVENTION

The present disclosure provides a method for efficient determination of the exposure conditions and the mask pattern to thereby enable the formation of a high accuracy pattern on a substrate.

The present disclosure relates to a determining method for determining by use of a computer an effective light source distribution formed by an illumination optical system and a pattern of a mask used in an exposure apparatus including the illumination optical system configured to illuminate the mask using light from a light source and a projection optical system configured to project an image of a plurality of pattern elements of the mask onto a substrate. The method includes the step of setting an evaluation position for evaluating an image of the plurality of pattern elements of the mask on an image plane of the projection optical system, and an evaluation item for evaluation at the evaluation position, a step of setting a first parameter to define the shape of the plurality of pattern elements of the mask, a step of setting a second parameter to define the effective light source distribution, and a step of repeating a process of calculation of the image of the plurality of pattern elements of the mask and calculation of the value of the evaluation item while varying the value of the first parameter and the second parameter to thereby determine the effective light source distribution and the pattern of the mask. In the step of setting the first parameter, the parameters of pattern elements in the plurality of pattern elements of the mask are set as one parameter by use of a value of an index representing the proximity effect that an adjacent pattern element adjacent to an evaluation pattern element in the plurality of pattern elements of the mask have on the image of the evaluation pattern element at the evaluation position of the evaluation pattern element.

Further features of the present invention will become apparent from the following description of exemplary embodiments with reference to the attached drawings.

BRIEF DESCRIPTION OF THE DRAWINGS

FIG. 6 is a flowchart that illustrates a sequence of the determining method according to a third exemplary embodiment.

DESCRIPTION OF THE EMBODIMENTS

The preferred embodiment for execution of the present disclosure will be described below with reference to the figures.

First Exemplary Embodiment

Figure 1:
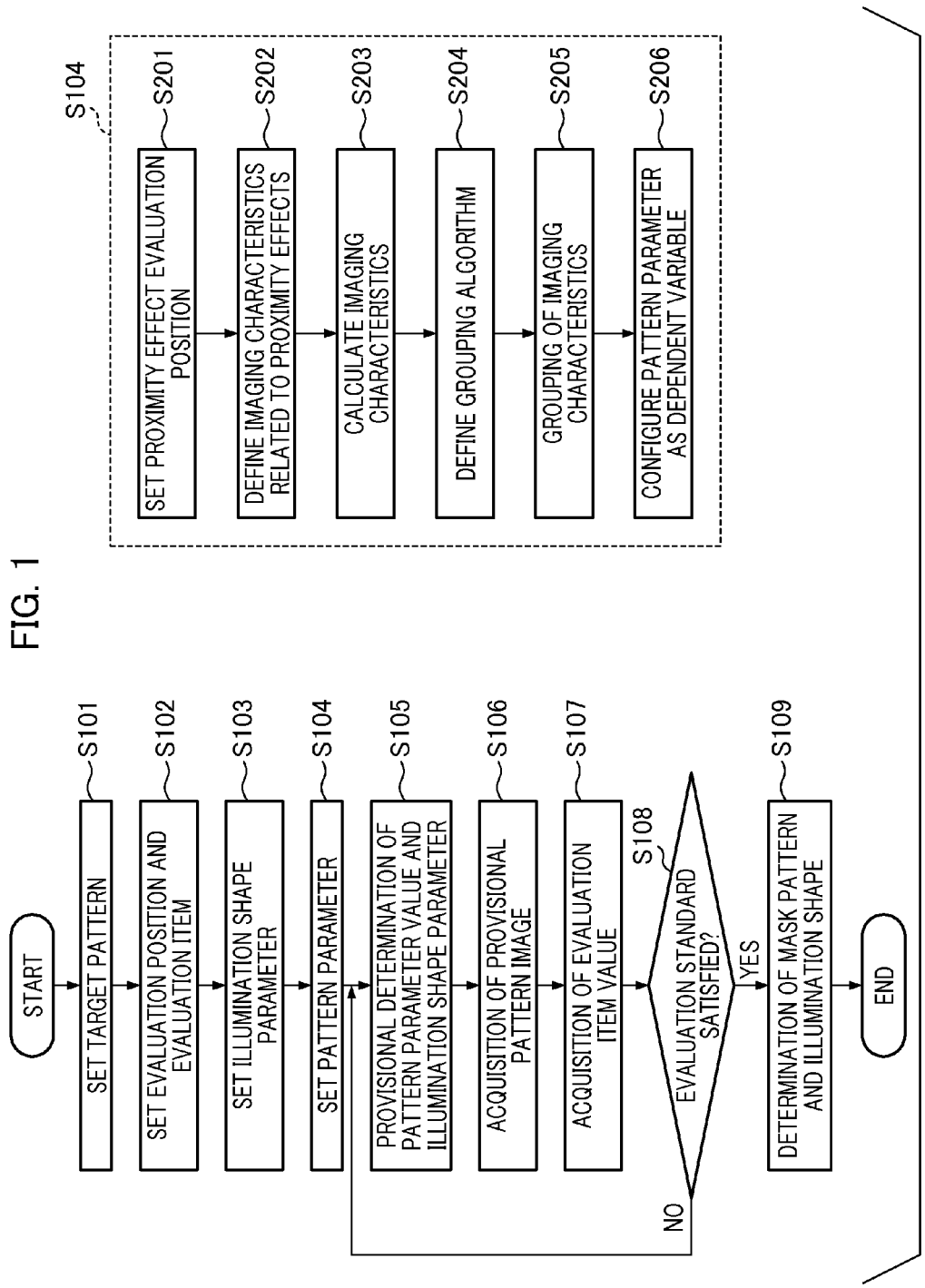
FIG. 1 is a flowchart that illustrates a sequence of the determining method according to a first exemplary embodiment.

Firstly, the determining method for the exposure conditions and the mask pattern related to a first exemplary embodiment of the present disclosure will be described. For example, in a lithography step included in the manufacturing process for a semiconductor device or the like, an exposure apparatus is used that is configured to illuminate light onto the mask (original) by use of an illumination optical system that includes a light source and thereby transfer the pattern formed on the mask through a projection optical system onto a photosensitive substrate (a wafer or the like). In particular, the determining method according to the present exemplary embodiment determines (optimizes) the pattern of the mask used in this type of exposure apparatus and the illumination shape (effective light source distribution) particularly when illumination of the mask is configured as an exposure condition. In this context, the illumination shape is the light intensity distribution formed on the pupil plane of the illumination optical system, and also includes the angular distribution of the light that illuminates the mask. FIG. 1 is a flowchart that illustrates a sequence of the determining method according to this exemplary embodiment. The determining method is executed by a general-purpose information processing apparatus (computer) for example in a configuration of a program.

Firstly, in S101, the pattern (target pattern) to be formed on the substrate is set. The target pattern is configured as various arrays (dispositions) depending on the circumstances, and includes a regular array such as a test pattern, a pattern that has a random disposition such as a device pattern other than a memory cell, or the like. Next, in S102, the evaluation positions for evaluation of the image of the provisional pattern (transfer pattern) formed on the image plane of the projection optical system, and the features for evaluation at the evaluation positions are set. The features for evaluation include at least one of the dimensions of the image of the provisional pattern, the defocus characteristics, the change in the dimensions relative to the exposure light amount of the provisional pattern, or the scope of the focus or exposure amount that is focused as a given standard as the image of the provisional pattern. Next, in S103, the illumination shape parameter (second parameter) is set to define the provisional illumination shape. For example, an exposure parameter that characterizes the basic shape (for example, dipole) shape or quadrupole (cross pole) shape of the illumination shape is set as an illumination shape parameter. Next, in S104, the pattern parameter (first parameter) is set to define the shape of the provisional pattern corresponding to the target pattern. More specifically, the mask pattern is configured as a plurality of polygons, and the parameter that characterizes the polygons is set as the pattern parameter. In this configuration, the shape of the mask pattern is caused to correspond to the shape that is formed by the combination of the plurality of polygons, and the length of the respective sides of the plurality of polygons is set as the pattern parameter. The flow (from S201 to S206) of setting of the pattern parameters in S104 will be described below, but firstly the flow including and after S105 will be described.

In S105 to S109, a parameter space is configured from the pattern parameter that was set in S104 and the illumination shape parameter that was set in S103. In the parameter space, the pattern parameter and the illumination shape parameter are optimized. The pattern parameter and the illumination shape parameter have a limited range, and therefore, it is necessary to optimize the pattern parameter and the illumination shape parameter within that limited range. Firstly, in S105, a provisional calculation is performed for the value for the pattern parameter value and the illumination shape parameter value. The determining method according to the present embodiment converges towards the optimal value by varying the value of the pattern parameter value and the illumination shape parameter value. Therefore, when in the limited range, an arbitrary value can be provisionally determined as the value for the pattern parameter value and the illumination shape parameter value. Next, in S106, a provisional pattern image formed on the image plane of the projection optical system is acquired (calculated) based on the pattern parameter value and the illumination shape parameter value that were provisionally determined in S105. More specifically, an image of the provisional pattern is acquired when the provisional pattern defined by the pattern parameter value that was provisionally determined in S105 is illuminated using the provisional illumination shape (provisional effective light source distribution) defined by the illumination shape parameter value that was provisionally determined in S105. Next, in S107, the value for the evaluation items at the evaluation positions set in S102 are acquired (calculated) in relation to the image of the provisional pattern acquired in S106. Then in S108, it is determined whether or not the value of the evaluation items at the evaluation positions on the image of the provisional pattern satisfies the evaluation standard. The evaluation standard is preset for each evaluation item in response to the performance of the exposure apparatus or the accuracy of the target pattern. In this context, when it is determined that the value of the evaluation items at the evaluation positions on the image of the provisional pattern satisfies the evaluation standard (YES), the processing proceeds to S109. On the other hand, when it is determined that the value of the evaluation items at the evaluation positions on the image of the provisional pattern does not satisfy the evaluation standard (NO), the processing returns to S105 and the pattern parameter value and the illumination shape parameter value are provisionally determined once again to thereby repeat the steps in S106, S107 and S108. In other words, the pattern parameter value and the illumination shape parameter value are varied, and the processing is repeated until the value of the evaluation items at the evaluation positions on the image of the provisional pattern satisfies the evaluation standard. When the pattern parameter value and the illumination shape parameter value are provisionally determined once again, the combination of the pattern parameter value and the illumination shape parameter value enables provisional determination of a value that has not been previously provisionally determined. At this time, rather than varying both of the pattern parameter value and the illumination shape parameter value, only one of those values is varied. Then, in S109, firstly, the provisional pattern that is defined by the pattern parameter that was provisionally determined in S104 is determined as the mask pattern. Then, the provisional illumination shape that is defined by the illumination pattern parameter that was provisionally determined in S104 is determined as the illumination shape (exposure condition) when illuminating the mask.

Figure 2A:
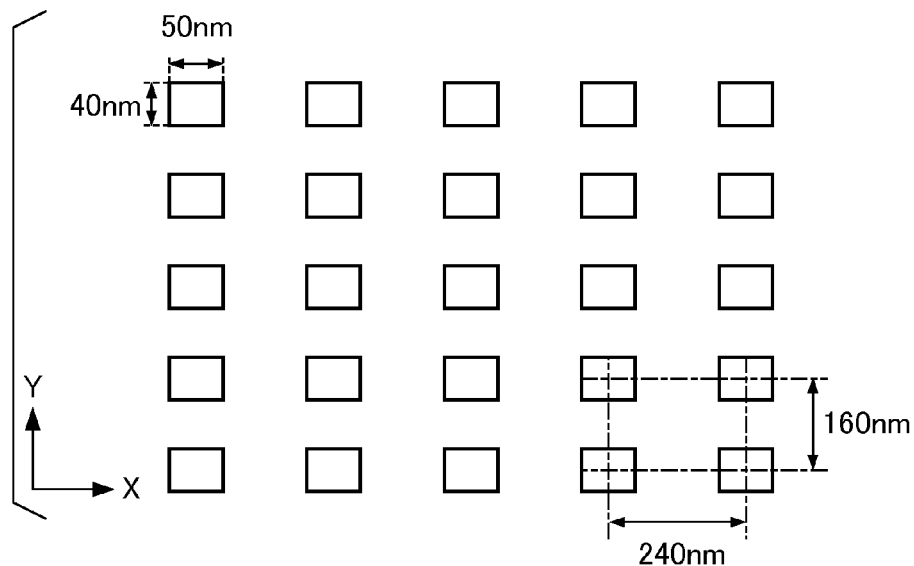
FIG. 2A illustrates the shape of a target pattern according to the first exemplary embodiment.
Figure 2B:
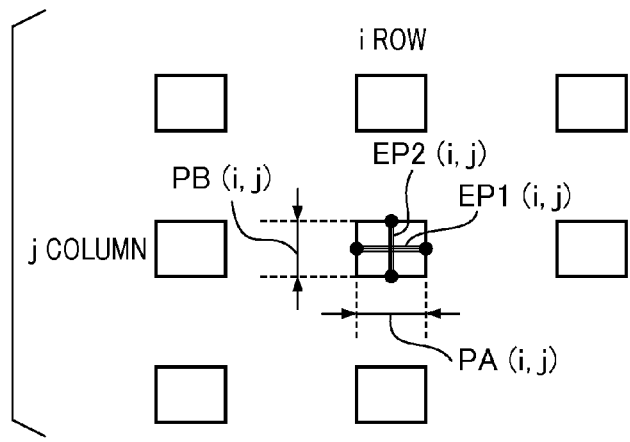
FIG. 2B illustrates an example of setting the pattern parameters according to the first exemplary embodiment.
Figure 2C:
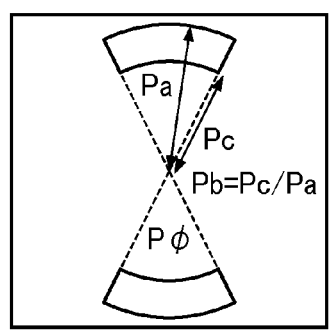
FIG. 2C illustrates an illumination shape according to the first exemplary embodiment.
Figure 2D:
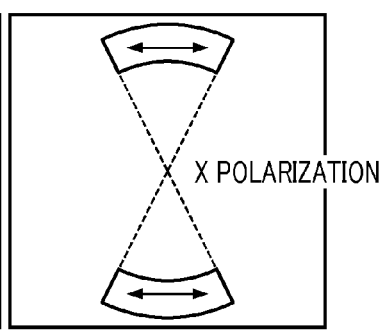
FIG. 2D illustrates a polarization direction in relation to the illumination shape according to the first exemplary embodiment.

Next, prior to description of the flow (from S201 to S206) of setting the pattern parameters in S104 which is the characteristic feature of the present exemplary embodiment, for the purposes of reference, a configuration in which the flow from S201 to S206 is omitted will be described in order to clarify the advantages of the present exemplary embodiment. In particular, a configuration will be described in which the image forming characteristics associated with an optical proximity effect (the effect of the adjacent mask pattern on an image at the evaluation position) uses a index based on the critical dimension (CD) difference between a central pattern and other patterns. Firstly, a first comparative example of using all variables for the mask will be described. In the first comparative example, the target pattern set in S101 is configured as an arrangement example having a plurality of similar rectangular patterns. FIG. 2A to 2D are schematic plan views of the target pattern shape or illumination shape in the first comparative example. The respective conditions in FIG. 2A to 2D are also applied to the exemplary embodiment described below (when the setting of the pattern parameter from S201 is considered). FIG. 2A is a schematic figure illustrating the shape of the target pattern. The target pattern includes a plurality of pattern elements in a 5×5 lattice configuration having a pitch of 240 nm in the X direction and 160 nm in the Y direction. One of these patterns is configured as a rectangle having an X width of 50 nm and a Y width of 40 nm. FIG. 2B is a schematic figure illustrating a setting example of the pattern parameter. The length of the respective sides of the rectangle in the j-th row and i-th column (length in the X direction and Y direction) PA(i,j) and PB(i,j) {1 smaller than or equal to i smaller than or equal to 5.1 smaller than or equal to j smaller than or equal to 5} are set as a pattern parameter in relation to the mask pattern. FIG. 2C is a schematic figure illustrating the illumination pattern when illuminating the mask (basic shape of the illumination shape). The illumination shape is configured with a dipole shape as illustrated in FIG. 2C and has the same intensity in the circumferential direction and in the aperture angle direction. In relation to the illumination shape, Pa is set as the outer σ of the illumination shape, and the ratio Pb of the outer σ and inner σ and the aperture angle Pφ are set as illumination shape parameters. FIG. 2D is a schematic figure illustrating polarization direction in the illumination shape. The polarization direction is taken to be the X polarized light.

As described above, the pattern parameter is set to a limited range taking into account the manufacturing characteristics of the mask or the device characteristics. For example, when the pattern parameters PA, PB are too small, the pattern under examination will not be transferred. On the other hand, when the pattern parameters PA, PB are too large, the interval between adjacent patterns will become narrow, and there is the possibility that desired resolution will not be obtained. In this regard, the lower limiting value and upper limiting value of the pattern parameter are suitably set in response to the tolerance of the device, the superimposition accuracy and the dimensions of the pattern, or the like. In the same manner, the illumination shape parameter is set to a limited range taking into account the lithography characteristics of the mask or the performance of the exposure apparatus. Even when the shape of the illumination shape parameter can be defined, if the exposure apparatus (illumination optical system) cannot form that shape, the value for the illumination shape parameter is not of practical use. In this regard, a lower limiting value and an upper limiting value for the illumination shape parameter are set in a range which can be formed by the exposure apparatus. Optimization of the illumination shape and the mask pattern in relation to the illumination shape illustrated in FIG. 2C and the mask pattern illustrated in FIG. 2B is considered when the wavelength of the exposure light is 193 nm and the aperture number (NA) of the projection optical system is 1.35.

Firstly, in S102, the evaluation position for evaluation of the image of the provisional pattern corresponding to the target pattern is set as illustrated in FIG. 2B to evaluation positions EP1 (i,j) and EP2 (i,j) {1 smaller than or equal to i smaller than or equal to 5.1 smaller than or equal to j smaller than or equal to 5}. The ideal dimensions at the evaluation positions EP1, EP2 (reference values) are respectively 50 nm, and 40 nm. The feature for evaluation is set to the root mean square CD_RMS (nm) of the difference between the reference dimensions and the image dimensions of the provisional pattern. The limiting range of the pattern parameter PA, PB is set to 20 nm is smaller than PA (i,j) is smaller than 100 nm, and 10 nm is smaller than PB (i,j) is smaller than 90 nm. Furthermore, the limiting range of the illumination shape parameter is set to 0.7 is smaller than Pa is smaller than 0.95, 0.5 is smaller than Pb is smaller than 0.8, and 0 degrees is smaller than Pφ is smaller than 150 degrees. Table 1 illustrates the allocation of the pattern parameter PA and Table 2 illustrates the allocation of the pattern parameter PB. A parameter space (PA(i,j), PB(i,j), Pa, Pb, Pφ) {1 smaller than or equal to i smaller than or equal to 5.1 smaller than or equal to j smaller than or equal to 5} that includes the pattern parameters PA and PB and the illumination shape parameter is configured using this setting.

TABLE 1

|       | i = 1     | i = 2     | i = 3     | i = 4     | i = 5     |
|-------|-----------|-----------|-----------|-----------|-----------|
| j = 1 | PA(1, 1)  | PA(2, 1)  | PA(3, 1)  | PA(4, 1)  | PA(5, 1)  |
| j = 2 | PA(1, 2)  | PA(2, 2)  | PA(3, 2)  | PA(4, 2)  | PA(5, 2)  |
| j = 3 | PA(1, 3)  | PA(2, 3)  | PA(3, 3)  | PA(4, 3)  | PA(5, 3)  |
| j = 4 | PA(1, 4)  | PA(2, 4)  | PA(3, 4)  | PA(4, 4)  | PA(5, 4)  |
| j = 5 | PA(1, 5)  | PA(2, 5)  | PA(3, 5)  | PA(4, 5)  | PA(5, 5)  |

TABLE 2

|       | i = 1     | i = 2     | i = 3     | i = 4     | i = 5     |
|-------|-----------|-----------|-----------|-----------|-----------|
| j = 1 | PB(1, 1)  | PB(2, 1)  | PB(3, 1)  | PB(4, 1)  | PB(5, 1)  |
| j = 2 | PB(1, 2)  | PB(2, 2)  | PB(3, 2)  | PB(4, 2)  | PB(5, 2)  |
| j = 3 | PB(1, 3)  | PB(2, 3)  | PB(3, 3)  | PB(4, 3)  | PB(5, 3)  |
| j = 4 | PB(1, 4)  | PB(2, 4)  | PB(3, 4)  | PB(4, 4)  | PB(5, 4)  |
| j = 5 | PB(1, 5)  | PB(2, 5)  | PB(3, 5)  | PB(4, 5)  | PB(5, 5)  |

Figure 3:
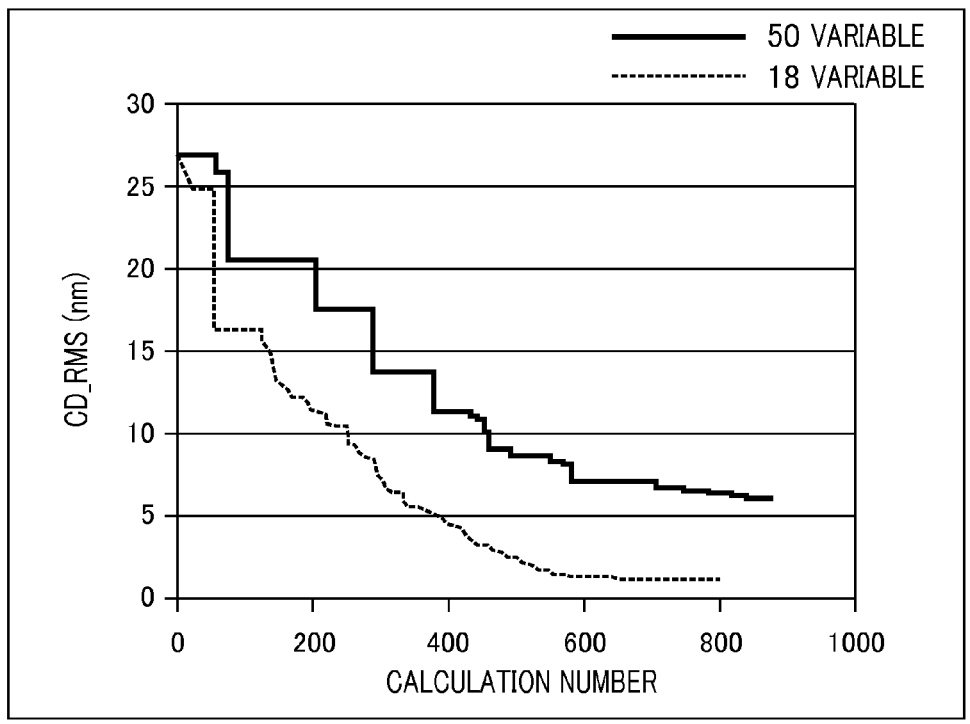
FIG. 3 is a graph that illustrates an attenuation of the evaluation item value in respective comparative examples.

In this context, to clarify the reduction effect of the optimizing variables, firstly, simultaneous optimization will be performed using a downhill simplex method of 53 variables (including 50 pattern parameters) as independent variables and without reducing the number of variables. FIG. 3 is a graph that illustrates an attenuation of the evaluation item value in this case, and shows CD_RMS (nm) that is the evaluation item value corresponding to the number of calculations (times) performed for optimization. In particular, the notation of 50variable denotes the first comparative example. As shown by the results illustrated in FIG. 3, the evaluation item value in the first comparative example continues to attenuate after 800 calculations, and therefore requires an extremely long period of time to converge.

Furthermore, a second comparative example will be described in relation to use of variables that take into account the symmetry of the target pattern. Generally when the number of optimization variables used in an optimization calculation is reduced, it is known that there is a tendency for more rapid convergence. In this context, for the purposes of reference, a configuration will be considered in which the number of variables is reduced by use of information related to the symmetry of the physical shape of the pattern without considering the flow from S201 to S206 in the same manner as the first comparative example. In this configuration, the method of reducing the number of pattern parameters is to reduce the variables by use of the symmetry characteristics such as the mirror inversion or repetition of the disposition arrangement of adjacent shapes. For example, the pattern parameter of the pattern (group) as illustrated in FIG. 2A can be reduced by making common variables for symmetrical patterns as illustrated in Formula (1) to Formula (4) below.

$$PA(1,j)=PA(5,j) \quad (1)$$

$$PA(2,j)=PA(4,j) \quad (2)$$

$$PA(i,1)=PA(i,5) \quad (3)$$

$$PA(i,2)=PA(i,4) \quad (4)$$

Table 3 illustrates the allocation of the pattern parameter PA when using the variables that are common to the above configuration. Table 4 illustrates the allocation of pattern parameters PB. In Table 3 and Table 4, the pattern parameters that have the same variable name have the same value. As shown by these tables, there are 18 pattern parameters in this configuration, which makes 21 variables when added to the three illumination shape parameters. Optimization was performed using a downhill simplex method with these 21 variables (including 18 pattern parameters) as independent variables. The attenuation of the evaluation item values corresponds to the notation of 18variable in the graph shown in FIG. 3. Table 5 shows the determined values for the pattern parameters PA and Table 6 shows the determined values for the pattern parameter PB. Furthermore, the determined values for the illumination shape parameter at this time are Pa with a value of 0.904, Pb with a value of 0.637, and Pφ of 53 degrees.

TABLE 3

|       | i = 1    | i = 2    | i = 3    | i = 4    | i = 5    |
|-------|----------|----------|----------|----------|----------|
| j = 1 | PA(1, 1) | PA(2, 1) | PA(3, 1) | PA(2, 1) | PA(1, 1) |
| j = 2 | PA(1, 2) | PA(2, 2) | PA(3, 2) | PA(2, 2) | PA(1, 2) |
| j = 3 | PA(1, 3) | PA(2, 3) | PA(3, 3) | PA(2, 3) | PA(1, 3) |
| j = 4 | PA(1, 2) | PA(2, 2) | PA(3, 2) | PA(2, 2) | PA(1, 2) |
| j = 5 | PA(1, 1) | PA(2, 1) | PA(3, 1) | PA(2, 1) | PA(1, 1) |

TABLE 4

|       | i = 1    | i = 2    | i = 3    | i = 4    | i = 5    |
|-------|----------|----------|----------|----------|----------|
| j = 1 | PB(1, 1) | PB(2, 1) | PB(3, 1) | PB(2, 1) | PB(1, 1) |
| j = 2 | PB(1, 2) | PB(2, 2) | PB(3, 2) | PB(2, 2) | PB(1, 2) |
| j = 3 | PB(1, 3) | PB(2, 3) | PB(3, 3) | PB(2, 3) | PB(1, 3) |
| j = 4 | PB(1, 2) | PB(2, 2) | PB(3, 2) | PB(2, 2) | PB(1, 2) |
| j = 5 | PB(1, 1) | PB(2, 1) | PB(3, 1) | PB(2, 1) | PB(1, 1) |

TABLE 5

|       | i = 1 | i = 2 | i = 3 | i = 4 | i = 5 |
|-------|-------|-------|-------|-------|-------|
| j = 1 | 75.1  | 74.9  | 65.3  | 74.9  | 75.1  |
| j = 2 | 60.5  | 75.3  | 59.6  | 75.3  | 60.5  |
| j = 3 | 69.8  | 60.6  | 54.1  | 60.6  | 69.8  |
| j = 4 | 60.5  | 75.3  | 59.6  | 75.3  | 60.5  |
| j = 5 | 75.1  | 74.9  | 65.3  | 74.9  | 75.1  |

TABLE 6

|       | i = 1 | i = 2 | i = 3 | i = 4 | i = 5 |
|-------|-------|-------|-------|-------|-------|
| j = 1 | 48.0  | 48.2  | 54.4  | 48.2  | 48.0  |
| j = 2 | 56.2  | 45.6  | 55.9  | 45.6  | 56.2  |
| j = 3 | 49.0  | 56.8  | 62.3  | 56.8  | 49.0  |
| j = 4 | 56.2  | 45.6  | 55.9  | 45.6  | 56.2  |
| j = 5 | 48.0  | 48.2  | 54.4  | 48.2  | 48.0  |

In the second comparative example, as illustrated in FIG. 3, convergence to optimization is more rapid than the configuration in which the pattern parameters in the first comparative example are all independent variables. For the purposes of reference, Table 7 illustrates the values of CD_RMS (nm) and the calculation number for optimization in the first comparative example and the second comparative example.

TABLE 7

|            | CD_RMS (nm)   |              |
|------------|---------------|--------------|
| # of calc. | 50 variables  | 18 variables |
| 200        | 20.5          | 11.5         |
| 400        | 11.4          | 4.5          |
| 600        | 7.1           | 1.2          |
| 800        | 6.4           | 1.1          |

In this manner, the previously independent pattern parameters can be reduced by at least half by use of symmetry characteristics such as mirror inversion in relation to a pattern that has a regular arrangement such as a test pattern. However, there are actually difficulties associated with a configuration of less than or equal to 18 variables as shown in Table 3 and Table 4 when using compression of variables based on symmetry characteristics as in the second comparative example. In contrast to a test pattern, since there are few pattern groups that exhibit repetition or symmetry characteristics in a pattern having a random arrangement such as a device pattern other than that for a memory cell, it is difficult to efficiently enable further compression using that method. That is to say, it is not sufficient to merely consider the symmetry of the pattern shape during compression of variables in the above manner. In this regard, the present exemplary embodiment as described below reduces the number of optimization variables without reference to the extraction of symmetry characteristics of the pattern shape.

Firstly, in S201 in FIG. 1, an evaluation position (second evaluation position) is set for evaluation of image forming characteristics related to the proximity effect of the transfer pattern formed on the image plane of the projection optical system. The same positions as the evaluation positions EP1, EP2 illustrated in FIG. 2B are treated as evaluation positions for proximity effects. Furthermore, since the pattern parameters PA, PB configure one side of a polygon, the width to both ends of the side is taken to be the object for evaluation. When the pattern parameter is an edge position of the polygon, the shift components of the image can be taken to be the object for evaluation.

Next, in S202, the image forming characteristics related to the proximity effect are defined with reference to the image forming characteristics at the evaluation position or the illumination shape parameter. For example, the dimensional difference (CD difference) between the image of the pattern under examination and the image of a target pattern (central pattern, the pattern elements in row 3, column 3 in FIG. 2A) of the transfer patterns that are illuminated may be used as an index for the image forming characteristics. Alternatively, the CD difference at the same evaluation position using two illumination (a first illumination and a second illumination) may be used as the index. In this manner, although the image forming characteristics that vary in response to the illumination shape may configure a representative index for proximity effects, there is no limitation in relation to that index. In particular, in the present exemplary embodiment, Pa=0.91, Pb=0.73 and Pϕ=30 degrees are set as illumination shape parameters, and CD values of CD_EP1 and CD_EP2 are calculated for each evaluation position for proximity effects. The values ΔEP1, ΔEP2 obtained from Formula (5) and Formula (6) are defined as the image forming characteristics related to the proximity effects.

$$\Delta EP1(i,j) = CD\_EP1(i,j) - CD\_EP1(3,3) \quad (5)$$

$$\Delta EP2(i,j) = CD\_EP2(i,j) - CD\_EP2(3,3) \quad (6)$$

Although the general definition of image forming characteristics is not limited to a set value for the illumination shape parameters used in the present exemplary embodiment, it is preferred that it falls within a set range during optimization.

Next, in S203, the values of the image forming characteristics at all evaluation positions for proximity effects are acquired (calculated) based on the definitions expressed in Formula (5) and Formula (6). The calculation results for the image forming characteristics ΔEP1 acquired based on the definitions expressed in Formula (5) are shown in Table 8, and the calculation results for the image forming characteristics ΔEP2 acquired based on the definitions expressed in Formula (6) are shown in Table 9.

TABLE 8

|       | i = 1 | i = 2 | i = 3 | i = 4 | i = 5 |
|-------|-------|-------|-------|-------|-------|
| j = 1 | -11.1 | -10.3 | -9.9  | -10.3 | -11.1 |
| j = 2 | -2.1  | -1.6  | -1.3  | -1.6  | -2.1  |
| j = 3 | -0.6  | -0.2  | 0.0   | -0.2  | -0.6  |
| j = 4 | -2.1  | -1.6  | -1.3  | -1.6  | -2.1  |
| j = 5 | -11.1 | -10.3 | -9.9  | -10.3 | -11.1 |

TABLE 9

|       | i = 1 | i = 2 | i = 3 | i = 4 | i = 5 |
|-------|-------|-------|-------|-------|-------|
| j = 1 | -7.9  | -7.1  | -6.8  | -7.1  | -7.9  |
| j = 2 | -1.9  | -1.4  | -1.1  | -1.4  | -1.9  |
| j = 3 | -0.6  | -0.2  | 0.0   | -0.2  | -0.6  |
| j = 4 | -1.9  | -1.4  | -1.1  | -1.4  | -1.9  |
| j = 5 | -7.9  | -7.1  | -6.8  | -7.1  | -7.9  |

Next, in S204, an algorithm for grouping the image forming characteristics acquired in S203 into a plurality of groups is defined. The range of the image forming characteristics entered into the same group is specifically defined. Firstly, a group number n of the groupings is set. The group number n may determine in advance a value and may be directly input, or the numerical range of the image forming characteristics input into the same group may be defined to thereby calculate and determine the group number using the actual image forming characteristics. Herein, the group number is 8, and the algorithm defines a grouping of a total of 8 groups in relation to the image forming characteristics being 4 groups for ΔEP1 and 4 groups for ΔEP2. The set group number n is equal to the number of independent variables for the pattern parameters used in optimization. If it is assumed that the optimal value of the pattern parameter in the groupings differs in response to a large difference in image forming characteristics, it is preferred that there is a small deviation in image forming characteristics within the same group. This observation means that a median value for each group is calculated so that the sum of the squares of the respective differences from the image forming characteristics and the median value for each group of image forming characteristics is minimized. More specifically, when 4 groups are provided in relation to ΔEP1, the median value for the group is calculated as a value X(k) {k=1, 2, 3, 4}, and the value for X(k) is calculated to minimize Ex in Formula 7. In the same manner, when 4 groups are provided in relation to ΔEP2, the median value for the group is calculated as a value Y(k) {k=1, 2, 3, 4}, and the value for Y(k) is calculated to minimize Ey in Formula 8.

Equation 1

$$Ex = \sum_{j=1}^{5} \sum_{i=1}^{5} \text{Min}[(\Delta EP1(i,j) - X(1))^2, (\Delta EP1(i,j) - X(2))^2, \quad (7)$$
$$(\Delta EP1(i,j) - X(3))^2, (\Delta EP1(i,j) - X(4))^2]$$

Equation 2

$$Ey = \sum_{j=1}^{5} \sum_{i=1}^{5} \text{Min}[(\Delta EP2(i,j) - Y(1))^2, (\Delta EP2(i,j) - Y(2))^2, \quad (8)$$
$$(\Delta EP2(i,j) - Y(3))^2, (\Delta EP2(i,j) - Y(4))^2]$$

The resulting values for X(k) and Y(k) are shown in Table 10. When the group taking X(k) as the median value is taken to be GX(k) and the group taking Y(k) as the median value is taken to be GY(k), this is the same configuration as a categorization using the range shown in Table 11.

TABLE 10

| X(1) | -11.12 | Y(1) | -7.92 |
|------|--------|------|-------|
| X(2) | -10.14 | Y(2) | -7.03 |
| X(3) | -1.74  | Y(3) | -1.54 |
| X(4) | -0.32  | Y(4) | -0.33 |

TABLE 11

| $-\infty \leq GX(1) < -10.63$ |
|---|
| $-10.63 \leq GX(2) < -5.94$ |
| $-5.94 \leq GX(3) < -1.03$ |
| $-1.03 \leq GX(4) < \infty$ |
| $-\infty \leq GY(1) < -7.48$ |
| $-7.48 \leq GY(2) < -4.28$ |
| $-4.28 \leq GY(3) < -0.94$ |
| $-0.94 \leq GY(4) < \infty$ |

Next, in S205, the details of S204 are applied to the image forming characteristics acquired in S203 to thereby execute a grouping of the actual image forming characteristics. More specifically, a grouping is performed so that the value of X(k) and Y(k) coincide with the median value of the group. The actual grouping in relation to the image forming characteristics ΔEP1 illustrated in Table 8 are shown in Table 12, and the actual grouping in relation to the image forming characteristics ΔEP2 illustrated in Table 9 are shown in Table 13. As shown by these tables, when one group is configured by the same parameter, 50 pattern parameters can be compressed to a total of eight parameters.

TABLE 12

|       | i = 1 | i = 2 | i = 3 | i = 4 | i = 5 |
|-------|-------|-------|-------|-------|-------|
| j = 1 | GX(1) | GX(2) | GX(2) | GX(2) | GX(1) |
| j = 2 | GX(3) | GX(3) | GX(3) | GX(3) | GX(3) |
| j = 3 | GX(4) | GX(4) | GX(4) | GX(4) | GX(4) |
| j = 4 | GX(3) | GX(3) | GX(3) | GX(3) | GX(3) |
| j = 5 | GX(1) | GX(2) | GX(2) | GX(2) | GX(1) |

TABLE 13

|       | i = 1 | i = 2 | i = 3 | i = 4 | i = 5 |
|-------|-------|-------|-------|-------|-------|
| j = 1 | GY(1) | GY(2) | GY(2) | GY(2) | GY(1) |
| j = 2 | GY(3) | GY(3) | GY(3) | GY(3) | GY(3) |
| j = 3 | GY(4) | GY(4) | GY(4) | GY(4) | GY(4) |
| j = 4 | GY(3) | GY(3) | GY(3) | GY(3) | GY(3) |
| j = 5 | GY(1) | GY(2) | GY(2) | GY(2) | GY(1) |

Although the median values X(k) and Y(k) for the group are taken to be completely random, there is no limitation in this regard. For example, Dx and Dy may be defined as shown in Formula (9) and Formula (10), and the median value of X(k) and Y(k) as shown in Formula (II) and Formula (12) may be set as an arithmetic progression.

$$Dx = \{Max(\Delta EP1) - Min(\Delta EP1)\}/4 \quad (9)$$

$$Dy = \{Max(\Delta EP2) - Min(\Delta EP2)\}/4 \quad (10)$$

$$X(k) = (k-1) \times Dx + Min(\Delta EP1) + Dx/2 \quad (11)$$

$$Y(k) = (k-1) \times Dy + Min(\Delta EP2) + Dy/2 \quad (12)$$

In S206, the pattern parameters corresponding to the evaluation positions that are grouped into the same group are configured as dependent variables (that is to say, a single group of variables) and allocated as pattern parameters. Thereafter, the processing proceeds to S105 in FIG. 1.

Figure 4:
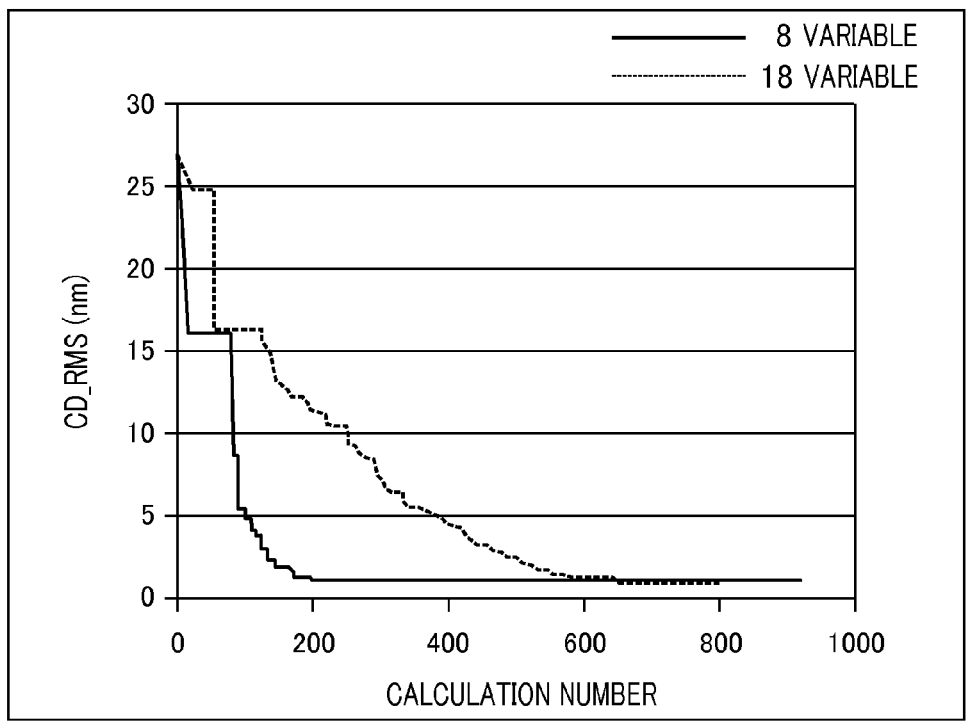
FIG. 4 is a graph that illustrates an attenuation of the evaluation item value according to the first exemplary embodiment.

FIG. 4 is a graph that illustrates an attenuation of the evaluation item value (the index value for image forming characteristics) when three illumination shape parameters and 8 independent pattern parameters are used in the present exemplary embodiment. The notation of 8variable denotes the result related to the present exemplary embodiment, and for the purposes of reference, the result (18variable) of the second comparative example is also noted. The determined values for the pattern parameter PA are shown in Table 14 and the determined values for the pattern parameter PB are shown in Table 15. The determined values for the illumination pattern parameter are such that Pa is 0.916, Pb is 0.647 and Pφ is 102 degrees.

TABLE 14

|       | i = 1 | i = 2 | i = 3 | i = 4 | i = 5 |
|-------|-------|-------|-------|-------|-------|
| j = 1 | 36.6  | 40.7  | 40.7  | 40.7  | 36.6  |
| j = 2 | 72.1  | 72.1  | 72.1  | 72.1  | 72.1  |
| j = 3 | 66.1  | 66.1  | 66.1  | 66.1  | 66.1  |
| j = 4 | 72.1  | 72.1  | 72.1  | 72.1  | 72.1  |
| j = 5 | 36.6  | 40.7  | 40.7  | 40.7  | 36.6  |

TABLE 15

|       | i = 1 | i = 2 | i = 3 | i = 4 | i = 5 |
|-------|-------|-------|-------|-------|-------|
| j = 1 | 44.8  | 41.0  | 41.0  | 41.0  | 44.8  |
| j = 2 | 26.2  | 26.2  | 26.2  | 26.2  | 26.2  |
| j = 3 | 27.9  | 27.9  | 27.9  | 27.9  | 27.9  |
| j = 4 | 26.2  | 26.2  | 26.2  | 26.2  | 26.2  |
| j = 5 | 44.8  | 41.0  | 41.0  | 41.0  | 44.8  |

In the present exemplary example, as illustrated in FIG. 4, convergence to optimization is more rapid than the configuration of 18 independent pattern parameters in the second comparative example. For the purposes of reference, Table 16 illustrates the values of CD_RMS (nm) and the calculation number for optimization in the second comparative example and the present exemplary example.

TABLE 16

| | CD_RMS (nm) | |
|---|---|---|
| # of calc. | 18 variables | 8 variables |
| 200 | 11.5 | 1.2 |
| 400 | 4.5  | 1.2 |
| 600 | 1.2  | 1.2 |
| 800 | 1.1  | 1.1 |

As described above, the determining method of the present exemplary embodiment firstly enables simultaneous optimization (determination) of both the illumination shape when the mask is illuminated and the mask pattern that is the pattern that can be formed on the substrate with sufficient accuracy. Furthermore, this determining method defines CD difference in the image between the pattern under examination and the target pattern as the index for the image forming characteristics related to proximity effects, and uses the pattern parameters that are grouped based on this index to thereby enable efficient introduction of an optimal solution with a lower calculation number than previously possible. For example, although there is a limit to the compression number when using compressing the variables that have conventionally used symmetry characteristics, in the present exemplary embodiment, the independent variables for optimization are effectively reduced without reference to symmetry characteristics. This determining method finds particular advantages in relation to reducing the convergence time in relation to optimization of an initial large number of pattern parameters when the pattern arrangement is random such as a device pattern other than a memory cell (a pattern including a comparatively large number of shapes).

As described above, the present exemplary embodiment provides a method for efficient determination of exposure conditions and a mask pattern that enables formation of a pattern with high accuracy on a substrate, in addition to a program for execution of this process on an information processing apparatus.

Second Exemplary Embodiment

Next, a determining method for exposure conditions and a mask pattern according to a second exemplary embodiment of the present disclosure will be described. The first exemplary embodiment considered image forming characteristics related to proximity effects as the image CD difference between the central pattern (target pattern) and the other patterns under examination in order to calculate the evaluation value. In contrast, the present exemplary embodiment differs from the first exemplary embodiment in that the image forming characteristics are separately defined, and in particular, considers a configuration in which the image forming characteristics related to proximity effects are taken to be the CD difference between two illumination operations (a first illumination and a second illumination). In the same manner as the first exemplary embodiment, a determination of the parameters is performed using the illumination shape illustrated in FIG. 2C and the mask pattern illustrated in FIG. 2B and so that the evaluation position of the proximity effects approaches the reference dimensions in the same manner. In the following description, the sequence of the determining method is described making reference to each step in FIG. 1 that was used in the description of the first exemplary embodiment above. The other steps in FIG. 1 that are not repeated in the following description are understood to be the same as those described in the first exemplary embodiment.

Firstly, the CD value of the evaluation position EP1(i,j) for proximity effects and CD value of the evaluation position EP2(i,j) for proximity effects when the illumination shape parameter is Pa=0.91, Pb=0.73 and Pϕ=30 degrees are configured respectively as CD1_EP1 (i,j) and CD1_EP2(i,j). On the other hand, the CD value of the evaluation position EP1 (i,j) for proximity effects and CD value of the evaluation position EP2(i,j) for proximity effects when the illumination shape parameter is Pa=0.95, Pb=0.73 and Pϕ=30 degrees are configured as respectively CD2_EP1 (i,j) and CD2_EP2(i,j). In this case, in S202 in FIG. 1, the image forming characteristics ΔEP1, ΔEP2 related to the proximity effects are defined as shown in Formula (13) and formula (14) below.

$$\Delta EP1(i,j) = CD2\_EP1(i,j) - CD1\_EP1(i,j) \quad (13)$$

$$\Delta EP2(i,j) = CD2\_EP2(i,j) - CD1\_EP2(i,j) \quad (14)$$

Next, in S203, the image forming characteristics at all the evaluation positions for proximity effects are acquired (calculated) based on the definition formula expressed by Formula (13) and Formula (14). The effect of the image forming characteristics ΔEP1 acquired based on the definition formula expressed in Formula (13) is shown in Table 17, and the effect of the image forming characteristics ΔEP2 acquired based on the definition formula expressed in Formula (14) is shown in Table 18.

TABLE 17

|  | i = 1 | i = 2 | i = 3 | i = 4 | i = 5 |
|---|---|---|---|---|---|
| j = 1 | −0.5 | −1.4 | −1.4 | −1.4 | −0.5 |
| j = 2 | 0.3 | −0.4 | −0.5 | −0.4 | 0.3 |
| j = 3 | −1.1 | −1.9 | −2.0 | −1.9 | −1.1 |
| j = 4 | 0.3 | −0.4 | −0.5 | −0.4 | 0.3 |
| j = 5 | −0.5 | −1.4 | −1.4 | −1.4 | −0.5 |

TABLE 18

|  | i = 1 | i = 2 | i = 3 | i = 4 | i = 5 |
|---|---|---|---|---|---|
| j = 1 | 0.0 | −0.7 | −0.7 | −0.7 | 0.0 |
| j = 2 | 1.6 | 1.0 | 0.9 | 1.0 | 1.6 |
| j = 3 | 0.7 | 0.1 | 0.0 | 0.1 | 0.7 |
| j = 4 | 1.6 | 1.0 | 0.9 | 1.0 | 1.6 |
| j = 5 | 0.0 | −0.7 | −0.7 | −0.7 | 0.0 |

Next, in S204, an algorithm is defined for grouping the image forming characteristics acquired in S203 into a plurality of groups. The group number n is set at 10, and herein, the algorithm defines a grouping of a total of 10 groups in relation to the image forming characteristics with 5 groups for ΔEP1 and 5 groups for ΔEP2. When ΔEP1 is divided into 5 groups, the median value for the group is calculated as a value X(k) {k=1, 2, 3, 4, 5}, and the value for X(k) is calculated to minimize Ex in Formula 7. In the same manner, when 5 groups are provided in relation to ΔEP2, the median value for the group is calculated as a value Y(k) {k=1, 2, 3, 4, 5}, and the value for Y(k) is calculated to minimize Ey in Formula 8. That is to say, the grouping algorithm is the same as that used in the first exemplary embodiment. The acquired values for X(k) and Y(k) are illustrated in Table 19. When the group having a median value of X(k) is taken to be GX(k), and the group having a median value of Y(k) is taken to be GY(k), the categorization is the same as that using the range illustrated in Table 20.

TABLE 19

| X(1) | −1.96 | Y(1) | −0.69 |
|---|---|---|---|
| X(2) | −1.43 | Y(2) | 0.01 |
| X(3) | −1.11 | Y(3) | 0.75 |
| X(4) | −0.49 | Y(4) | 0.98 |
| X(5) | 0.30 | Y(5) | 1.58 |

TABLE 20

| −∞ ≤ GX(1) < −1.69 |
|---|
| −1.69 ≤ GX(2) < −1.27 |
| −1.27 ≤ GX(3) < −0.8 |
| −0.8 ≤ GX(4) < −0.09 |
| −0.09 ≤ GX(5) < ∞ |
| −∞ ≤ GY(1) < −0.34 |
| −0.34 ≤ GY(2) < 0.38 |
| 0.38 ≤ GY(3) < 0.87 |
| 0.87 ≤ GY(4) < 1.28 |
| 1.28 ≤ GY(5) < ∞ |

Next, in S205, the details of S204 are applied to the image forming characteristics acquired in S203 to thereby execute a grouping of the actual image forming characteristics. A grouping is also performed in the present exemplary embodiment so that the value of X(k) and Y(k) coincide with the median value of the group. The actual grouping in relation to the image forming characteristics ΔEP1 illustrated in Table 17 are shown in Table 21, and the actual grouping in relation to the image forming characteristics ΔEP2 illustrated in Table 18 are shown in Table 22. As shown by these tables, when one group is configured by the same parameter, 50 pattern parameters can be compressed to a total of 10 parameters.

TABLE 21

|  | i = 1 | i = 2 | i = 3 | i = 4 | i = 5 |
|---|---|---|---|---|---|
| j = 1 | GX(4) | GX(2) | GX(2) | GX(2) | GX(4) |
| j = 2 | GX(5) | GX(4) | GX(4) | GX(4) | GX(5) |
| j = 3 | GX(3) | GX(1) | GX(1) | GX(1) | GX(3) |
| j = 4 | GX(5) | GX(4) | GX(4) | GX(4) | GX(5) |
| j = 5 | GX(4) | GX(2) | GX(2) | GX(2) | GX(4) |

TABLE 22

|  | i = 1 | i = 2 | i = 3 | i = 4 | i = 5 |
|---|---|---|---|---|---|
| j = 1 | GY(2) | GY(1) | GY(1) | GY(1) | GY(2) |
| j = 2 | GY(5) | GY(4) | GY(4) | GY(4) | GY(5) |
| j = 3 | GY(3) | GY(2) | GY(2) | GY(2) | GY(3) |
| j = 4 | GY(5) | GY(4) | GY(4) | GY(4) | GY(5) |
| j = 5 | GY(2) | GY(1) | GY(1) | GY(1) | GY(2) |

In S206, the pattern parameters corresponding to the evaluation positions that are divided into the same group are configured as dependent variables, the pattern parameters are allocated, and thereafter, the processing proceeds in the same manner as the first exemplary embodiment to S105.

Figure 5:
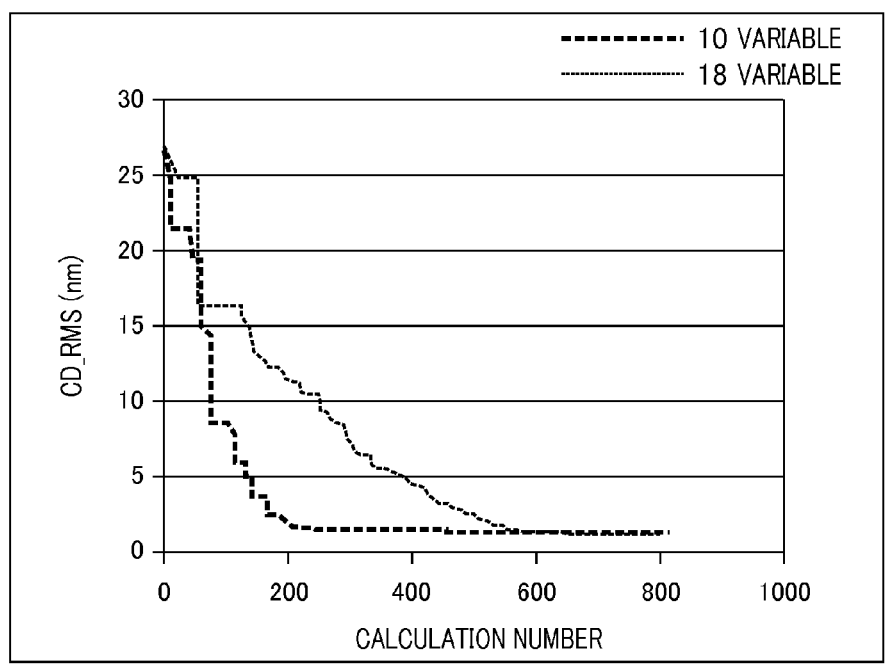
FIG. 5 is a graph that illustrates an attenuation of the evaluation item value according to a second exemplary embodiment.

FIG. 5 corresponds to FIG. 4 and is a graph that illustrates an attenuation of the evaluation item value (the index value for image forming characteristics) when three illumination shape parameters and 10 independent pattern parameters are used in the present exemplary embodiment. The notation of 10variable denotes the result of the present exemplary embodiment, and for the purposes of reference, the result (18variable) of the second comparative example is also noted. The determined values for the pattern parameter PA are shown in Table 23 and the determined values for the pattern parameter PB are shown in Table 24. The determined values for the illumination pattern parameter are such that Pa is 0.873, Pb is 0.728 and P$\phi$ is 74 degrees.

TABLE 23

|  | i = 1 | i = 2 | i = 3 | i = 4 | i = 5 |
| --- | --- | --- | --- | --- | --- |
| j = 1 | 51.5 | 46.9 | 46.9 | 46.9 | 51.5 |
| j = 2 | 39.2 | 51.5 | 51.5 | 51.5 | 39.2 |
| j = 3 | 73.5 | 50.3 | 50.3 | 50.3 | 73.5 |
| j = 4 | 39.2 | 51.5 | 51.5 | 51.5 | 39.2 |
| j = 5 | 51.5 | 46.9 | 46.9 | 46.9 | 51.5 |

TABLE 24

|  | i = 1 | i = 2 | i = 3 | i = 4 | i = 5 |
| --- | --- | --- | --- | --- | --- |
| j = 1 | 48.8 | 51.6 | 51.6 | 51.6 | 48.8 |
| j = 2 | 55.4 | 47.7 | 47.7 | 47.7 | 55.4 |
| j = 3 | 40.4 | 48.8 | 48.8 | 48.8 | 40.4 |
| j = 4 | 55.4 | 47.7 | 47.7 | 47.7 | 55.4 |
| j = 5 | 48.8 | 51.6 | 51.6 | 51.6 | 48.8 |

In the present exemplary example, as illustrated in FIG. 5, convergence to optimization is more rapid than the configuration using 18 independent pattern parameters in the second comparative example. For the purposes of reference, Table 25 illustrates the values of CD_RMS (nm) and the calculation number for optimization in the second comparative example and the present exemplary example.

TABLE 25

| | CD_RMS (nm) | |
| --- | --- | --- |
| # of calc. | 18 variables | 10 variables |
| 200 | 11.5 | 1.8 |
| 400 | 4.5 | 1.3 |
| 600 | 1.2 | 1.2 |
| 800 | 1.1 | 1.2 |

In the above manner, the determining method according to the present exemplary embodiment defines the CD difference between two illumination operations as the index for the image forming characteristics related to proximity effects and uses pattern parameters grouped with reference to the index to thereby obtain the same effect as the first exemplary embodiment.

Third Exemplary Embodiment

Next, a determining method for an exposure condition and a mask pattern according to a third exemplary embodiment will be described. In the present exemplary embodiment, convergence to optimization is still more rapid by using a grouping to reduce the independent optimization variables. In this manner, the degree of freedom in relation to variables is further increased and further enhances the final solution (acquire a best solution). In the present exemplary embodiment, convergence to optimization is still more rapid and a new step is added to the determining method according to the exemplary embodiments illustrated in FIG. 1 to thereby cause the resulting solution to approach a best solution.

FIG. 6 corresponds to FIG. 1 and is a flowchart that illustrates a sequence of the determining method according to the present exemplary embodiment. In FIG. 6, those steps that are the same as the steps illustrated in FIG. 1 are denoted by the same step numbers, and related description will not be repeated. In particular, a step configured to determine whether a defined calculation number has been exceeded is interposed as S301 between the step configured to acquire the evaluation item at the evaluation position set in S102 (S107) and a step configured to determine whether or not the value of the evaluation item satisfies the evaluation standard (S108). Furthermore, when the calculation number in S301 is determined to not have exceeded the predetermined number (YES), a step (S302) is included that is configured to vary (increase) the group number n. In this case, firstly, optimization of the pattern parameter and the illumination shape parameter is commenced by setting in advance of an initial group number n. Then, when the calculation number does not exceed the predetermined number (for example, 20 times), the processing proceeds to S302 and the group number is increased. In S302, for example, the increase is gradually implemented by 2 on the first occasion, 4 on the second occasion, 8 on the third occasion, 16 on the fourth occasion, and thereafter, the optimization process is continued in the same manner. The illumination shape parameter when calculating the image forming characteristics related to proximity effects applies the value obtained in relation to the immediately previous optimization process. Furthermore, the pattern parameter also applies the value obtained as a best solution as the initial value. In this manner, the present exemplary embodiment increases the number of pattern parameters in a stepwise manner, and therefore uses (inputs) the respective initial values for optimization during the optimization process as a value that is close to the best solution. Therefore, convergence to optimization is further advanced, and finally all variables can be configured as independent parameters and the resulting solution is the best solution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-257363 filed Nov. 26, 2012 which is hereby incorporated by reference herein in its entirety.

What is claimed is:

1. A determining method for determining by use of a computer an effective light source distribution formed by an illumination optical system and a pattern of a mask used in an exposure apparatus including the illumination optical system configured to illuminate the mask using light from a light source and a projection optical system configured to project an image of a plurality of pattern elements of the mask onto a substrate, the method including the steps of:
setting an evaluation position for evaluating an image of the plurality of pattern elements of the mask on an image plane of the projection optical system, and an evaluation item for evaluation at the evaluation position;

setting a first parameter to define the shape of the plurality of pattern elements of the mask;

setting a second parameter to define the effective light source distribution; and repeating a process of calculation of the image of the plurality of pattern elements of the mask and calculation of the value of the evaluation item while varying the value of the first parameter and the second parameter to thereby determine the effective light source distribution and the pattern of the mask, wherein the step of setting the first parameter comprises, calculating a value of an index representing a proximity effect for each of the plurality of pattern elements and setting the parameters of pattern elements in the plurality of pattern elements as one parameter based on the calculated value of the index for the each of the plurality of pattern elements, the value of the index representing the proximity effect that an adjacent pattern element adjacent to an evaluation pattern element in the plurality of pattern elements of the mask have on the image of the evaluation pattern element at the evaluation position of the evaluation pattern element.

2. The determining method according to claim 1, wherein the step of setting the first parameter includes the steps of:

defining image forming characteristics;

setting second evaluation positions configured to evaluate the image forming characteristics;

calculating each value for the image forming characteristics in relation to each of the second evaluation positions;

grouping the calculated values for the image forming characteristics into a preset group, and grouping the values for the plurality of the image forming characteristics into one group; and setting, as one parameter, the first parameters in the second evaluation positions corresponding to the values for the image forming characteristics that are grouped into one group.

3. The determining method according to claim 2, wherein the step of setting the first parameter includes the step of defining an algorithm for grouping the calculated values for the image forming characteristics into a preset number of groups, and wherein the algorithm is an algorithm for grouping within a range of values for the image forming characteristics that are input into the same group, and wherein, in the step of grouping, a median value for each group in the range of the values for the image forming characteristics is calculated, and grouping is executed for each group that includes the calculated median value.

4. The determining method according to claim 3, wherein the median value is calculated to minimize the sum of the squares of the differences between values of the respective image forming characteristics and the median value.

5. The determining method according to claim 3, wherein the median value is set using an arithmetic progression.

6. The determining method according to claim 1, wherein the index representing the proximity effect is the dimensional difference between the image of the adjacent pattern element and the image of the evaluation pattern element.

7. The determining method according to claim 1, wherein the index representing the proximity effect is the CD difference of the evaluation pattern element between when the evaluation pattern element is illuminated using a first effective light source distribution and when the evaluation pattern element is illuminated using a second effective light source distribution having a shape different from a shape of the first effective light source distribution.

8. The determining method according to claim 1, further including the step of varying the group number and repeating the determination of the pattern of the mask and the effective light source distribution.

9. The determining method according to claim 8, wherein whether or not to vary the group number is determined by whether or not the calculation number for determination of the pattern of the mask and the effective light source distribution has exceeded a predetermined number.

10. The determining method according to claim 1, wherein, in the step of setting the first parameter, the parameters of pattern elements of which the calculated value of the index is in a predetermined range are set as one parameter.

11. A non-transitory storage medium on which is stored a computer program for making a computer execute a determining method for determining by use of a computer an effective light source distribution formed by an illumination optical system and a pattern of a mask used in an exposure apparatus including the illumination optical system configured to illuminate the mask using light from a light source and a projection optical system configured to project an image of a plurality of pattern elements of the mask onto a substrate, the method including the steps of:

setting an evaluation position for evaluating an image of the plurality of pattern elements of the mask on an image plane of the projection optical system, and an evaluation item for evaluation at the evaluation position;

setting a first parameter to define the shape of the plurality of pattern elements of the mask;

setting a second parameter to define the effective light source distribution; and repeating a process of calculation of the image of the plurality of pattern elements of the mask and calculation of the value of the evaluation item while varying the value of the first parameter and the second parameter to thereby determine the effective light source distribution and the pattern of the mask, wherein the step of setting the first parameter comprises, calculating a value of an index representing a proximity effect for each of the plurality of pattern elements and setting the parameters of pattern elements in the plurality of pattern elements as one parameter based on the calculated value of the index for the each of the plurality of pattern elements, the value of the index representing the proximity effect that an adjacent pattern element adjacent to an evaluation pattern element in the plurality of pattern elements of the mask have on the image of the evaluation pattern element at the evaluation position of the evaluation pattern element.

12. A computer configured to execute a determining method for determining by use of a computer an effective light source distribution formed by an illumination optical system and a pattern of a mask used in an exposure apparatus including the illumination optical system configured to illuminate the mask using light from a light source and a projection optical system configured to project an image of a plurality of pattern elements of the mask onto a substrate, the method including the steps of:

setting an evaluation position for evaluating an image of the plurality of pattern elements of the mask on an image plane of the projection optical system, and an evaluation item for evaluation at the evaluation position;

setting a first parameter to define the shape of the plurality of pattern elements of the mask;

setting a second parameter to define the effective light source distribution; and repeating a process of calculation of the image of the plurality of pattern elements of the mask and calculation of the value of the evaluation item while varying the value of the first parameter and the second parameter to thereby determine the effective light source distribution and the pattern of the mask, wherein the step of setting the first parameter comprises, calculating a value of an index representing a proximity effect for each of the plurality of pattern elements and setting the parameters of pattern elements in the plurality of pattern elements as one parameter based on the calculated value of the index for the each of the plurality of pattern elements, the value of the index representing the proximity effect that an adjacent pattern element adjacent to an evaluation pattern element in the plurality of pattern elements of the mask have on the image of the evaluation pattern element at the evaluation position of the evaluation pattern element.

* * * * *